(12) United States Patent
Yu et al.

(10) Patent No.: US 11,984,398 B2
(45) Date of Patent: May 14, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yexiao Yu, Hefei (CN); Zhongming Liu, Hefei (CN); Jia Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 470 days.

(21) Appl. No.: 17/465,744

(22) Filed: Sep. 2, 2021

(65) Prior Publication Data

US 2022/0285261 A1 Sep. 8, 2022

Related U.S. Application Data

(63) Continuation of application No. PCT/CN2021/101943, filed on Jun. 24, 2021.

(30) Foreign Application Priority Data

Mar. 8, 2021 (CN) .......................... 202110250796.6

(51) Int. Cl.
*H01L 23/528* (2006.01)
*H01L 21/02* (2006.01)
(Continued)

(52) U.S. Cl.
CPC ...... *H01L 23/528* (2013.01); *H01L 21/02115* (2013.01); *H01L 21/02164* (2013.01);
(Continued)

(58) Field of Classification Search
CPC ............. H01L 23/528; H01L 21/02115; H01L 21/02164; H01L 21/02274; H01L 21/0228; H01L 21/31144; H01L 21/32139
See application file for complete search history.

(56) References Cited

U.S. PATENT DOCUMENTS

2011/0151632 A1 6/2011 Cho
2016/0203983 A1 7/2016 Kim et al.
(Continued)

FOREIGN PATENT DOCUMENTS

| CN | 109950311 A | 6/2019 |
|---|---|---|
| CN | 112447602 A | 3/2021 |
| HR | P20200971 T1 | 10/2020 |

OTHER PUBLICATIONS

International Search Report cited in PCT/CN2021/101943, dated Nov. 25, 2021, 11 pages.

*Primary Examiner* — Monica D Harrison
*Assistant Examiner* — Andre C Stevenson
(74) *Attorney, Agent, or Firm* — Cooper Legal Group, LLC

(57) ABSTRACT

A semiconductor structure and a manufacturing method thereof are provided. The manufacturing method of the semiconductor structure comprises: providing a substrate, comprising a polysilicon layer, a first conductive layer, a first dielectric layer, a mask layer, and a sacrificial layer sequentially formed thereon, wherein the sacrificial layer has a plurality of first trenches distributed at intervals; forming a first insulating layer on the sacrificial layer; forming a protective layer, the protective layer only covering a surface of the first insulating layer above the top surface of the sacrificial layer; removing the protective layer, part of the first insulating layer, the sacrificial layer, and part of the mask layer to form a first pattern layer; and removing part of the first dielectric layer, part of the first conductive layer, and part of the polysilicon layer by using the first pattern layer as a mask to form a BL structure.

15 Claims, 12 Drawing Sheets

(51) Int. Cl.
*H01L 21/311* (2006.01)
*H01L 21/3213* (2006.01)

(52) U.S. Cl.
CPC .... *H01L 21/02274* (2013.01); *H01L 21/0228* (2013.01); *H01L 21/31144* (2013.01); *H01L 21/32139* (2013.01)

(56) References Cited

U.S. PATENT DOCUMENTS

2020/0185271 A1\* 6/2020 Wallace ............ H01L 21/76897
2021/0151447 A1\* 5/2021 Chuang ............ H01L 29/66969

\* cited by examiner

SEMICONDUCTOR STRUCTURE AND MANUFACTURING METHOD THEREOF

CROSS-REFERENCE TO RELATED APPLICATIONS

This application is a continuation application of International Patent Application No. PCT/CN2021/101943, filed on Jun. 24, 2021, which claims priority to Chinese Patent Application No. 202110250796.6, filed with the Chinese Patent Office on Mar. 8, 2021 and entitled "SEMICONDUCTOR STRUCTURE AND MANUFACTURING METHOD THEREOF." International Patent Application No. PCT/CN2021/101943 and Chinese Patent Application No. 202110250796.6 are incorporated herein by reference in their entireties.

TECHNICAL FIELD

The present disclosure relates to the field of semiconductor production technologies, and in particular to a semiconductor structure and a manufacturing method thereof.

BACKGROUND

As a semiconductor device commonly used in an electronic device such as a computer, a DRAM (Dynamic Random Access Memory) is composed of a plurality of memory cells, and each memory cell usually includes a transistor and a capacitor. The transistor has a gate electrically connected to a wordline, a source electrically connected to a BL (Bit Line), and a drain electrically connected to a capacitor. A wordline voltage on a wordline can control the ON and OFF of the transistor, and therefore, through the BL, data information stored in the capacitor can be read or data information can be written into the capacitor.

As the feature size of semiconductor integrated circuit devices continues to shrink, the requirements for the manufacturing process of a semiconductor device such as a DRAM are getting higher and higher, and the BL design in a dense array region (Array) is very important. According to the current BL formation process, a pattern is transferred down step by step after a mask pattern is formed, so as to finally a BL pattern. However, due to the limitations of the current process, the mask pattern is easily distorted during the downward transfer process, resulting in poorer topography of the finally formed BL structure, such as uneven sidewalls of the formed bit line and the tilt of the entire BL; in this way, an adverse effect will be caused on the performance of a final semiconductor device, and in severe cases, the device may even be scrapped, thereby increasing the production cost of the semiconductor device.

SUMMARY

According to some embodiments, one aspect of the present disclosure provides a manufacturing method of a semiconductor structure, including the following steps:
  providing a substrate, the substrate including a polysilicon layer, a first conductive layer, a first dielectric layer, a mask layer, and a sacrificial layer sequentially formed thereon, wherein the sacrificial layer has a plurality of first trenches distributed at intervals and the polysilicon layer is electrically connected to an AA (Active Area) in the substrate;
  forming a first insulating layer on the sacrificial layer, the first insulating layer covering a top surface of the sacrificial layer, a bottom of the first trench and sidewalls of the first trench;
  forming a protective layer, the protective layer only covering a surface of the first insulating layer above the top surface of the sacrificial layer;
  removing the first insulating layer located at the bottom of the first trench;
  removing the protective layer, part of the first insulating layer, the sacrificial layer, and part of the mask layer to form a first pattern layer; and
  removing part of the first dielectric layer, part of the first conductive layer, and part of the polysilicon layer by using the first pattern layer as a mask to form a BL structure.

According to some embodiments, another aspect of the present disclosure further provides a semiconductor structure, including:
  a substrate; and
  a BL structure located on a surface of the substrate, the BL structure being formed by the manufacturing method of a semiconductor structure.

In the semiconductor structure and the manufacturing method thereof according to the embodiments of the present disclosure, the protective layer is formed to only cover the first insulating layer on the top surface of the sacrificial layer. In this way, during the subsequent removal of the first insulating layer at the bottom of the first trench, the top surface of the sacrificial layer and the first insulating layer on the sidewalls of the first trench will not be damaged; after the pattern in the sacrificial layer is transferred downward, a BL structure with flat and smooth sidewalls and vertical topography can be obtained, which improves the uniformity and consistency of the BL topography in the semiconductor structure and is contributed to improving the electrical performance of the semiconductor structure.

DESCRIPTION OF EMBODIMENTS

The semiconductor structure and the manufacturing method thereof according to the embodiments of the present disclosure will be described in detail below with reference to the accompanying drawings.

Figure 1:
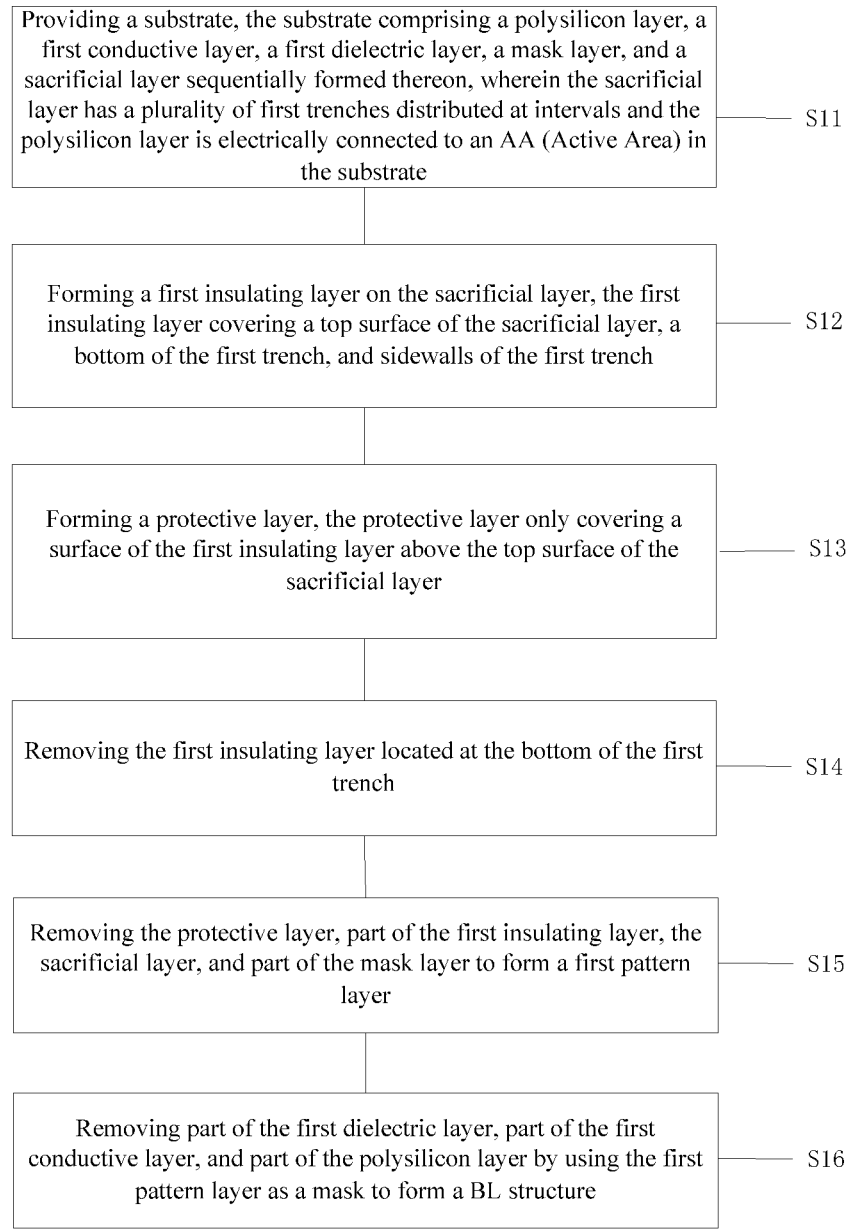
FIG. 1 is a flowchart of a manufacturing method of a semiconductor structure in an embodiment of the present application.
Figure 2A:
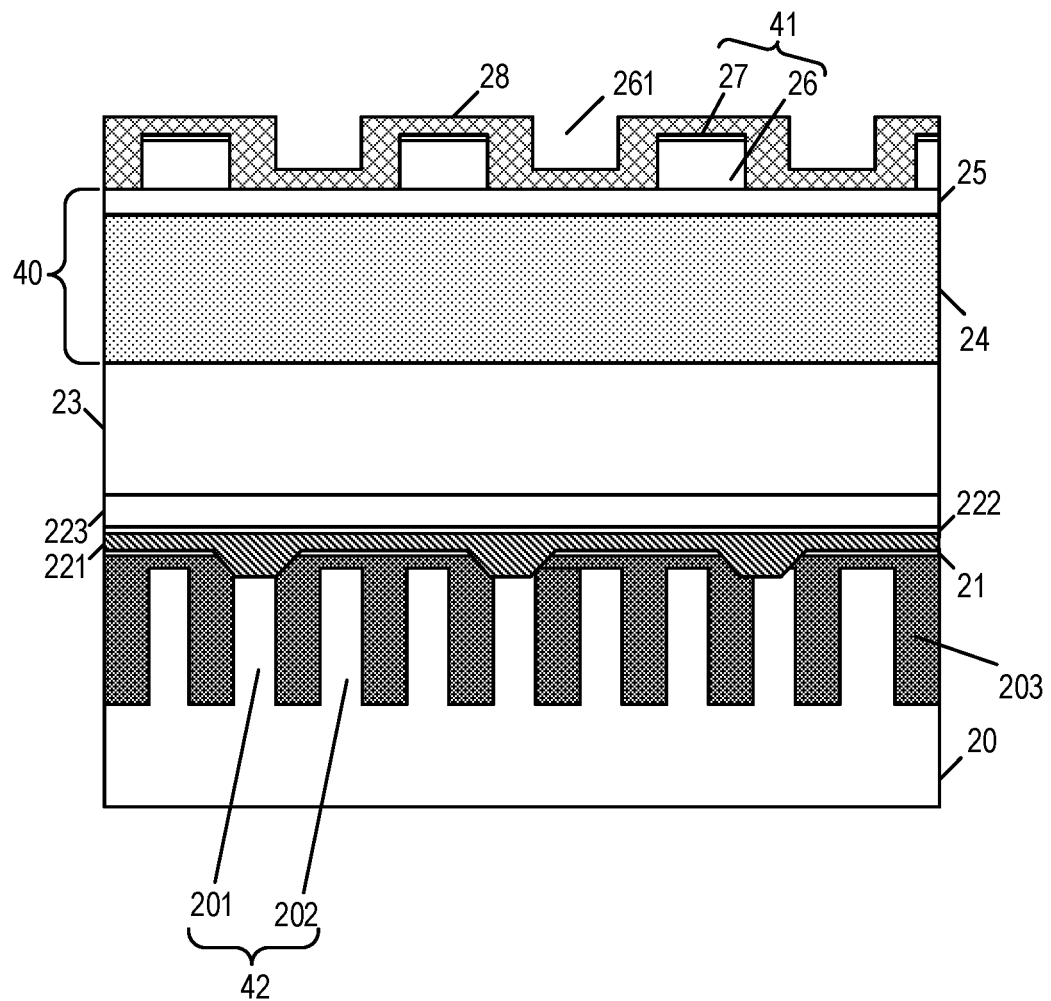
FIGS. 2A to 2N are schematic cross-sectional views of main processes during a manufacturing method of a semiconductor structure according to an embodiment of the present disclosure.

This embodiment provides a manufacturing method of a semiconductor structure. FIG. 1 is a flowchart of a manufacturing method of a semiconductor structure according to an embodiment of the present application; and FIGS. 2A to 2N are schematic cross-sectional views of main processes during a manufacturing method of a semiconductor structure according to an embodiment of the present disclosure. As shown in FIGS. 1 and 2A-2N, the manufacturing method of a semiconductor structure according to this embodiment includes the following steps:

In step S11, a substrate 20 is provided, and the substrate 20 includes a polysilicon layer 221, a first conductive layer 223, a first dielectric layer 23, a mask layer 40, and a sacrificial layer 41 sequentially formed thereon, wherein the sacrificial layer 41 has a plurality of first trenches 261 distributed at intervals and the polysilicon layer 221 is electrically connected to an AA (Active Area) 42 in the substrate, as shown in FIG. 2A.

As an example, the substrate 20 may be a Si substrate, a Ge substrate, a SiGe substrate, SOI (Silicon On Insulator, silicon on insulator), GOI (Germanium On Insulator, germanium on insulator) or the like. In this embodiment, an example where the substrate 20 is configured as a Si substrate is provided for description. The substrate 20 has a plurality of AAs 42 arranged in an array. The adjacent AAs 42 are electrically isolated by an STI (Shallow Trench Isolation) structure 203. The STI structure 203 is formed by forming a groove inside the substrate 20 and filling the inside of the groove with an insulating material. A material of the STI structure 203 may be, but is not limited to, an oxide material.

In this embodiment, an example where the AAs 42 include first AAs 201 and seconds AA 202 is provided for description, and the first AAs 201 and the second AAs 202 are alternately arranged inside the substrate 20. In other embodiments, those skilled in the art can also provide the AA 42 only including the first AA 201 or the second AA 202 according to actual needs.

In some embodiments, the substrate 20 further includes:
a metal barrier layer 222 located between the polysilicon layer 221 and the first conductive layer 223.

In this embodiment, after the substrate 20 is provided, process steps such as etching, filling, and doping can be carried out on the substrate 20 to form the AAs and the STI structure 203. Then, a polysilicon material, a metal barrier material, a first conductive material, a first dielectric material, a mask material, and a sacrificial material are deposited on the surface of the substrate 20 in sequence. As an example, firstly, a second dielectric material (e.g., silicon nitride) is deposited on the surface of the substrate 20 to form a spacer layer 21. Next, the spacer layer 21 and part of the substrate 20 are etched, and after the AA 42 inside the substrate 20 is exposed, a polysilicon material is deposited to form the polysilicon layer 221. The polysilicon layer 221 comes into direct contact with the AA 42 inside the substrate 20 and covers the surface of the spacer layer 21. Then, the metal barrier material such as TiN is deposited on a surface of the polysilicon layer 221 to form the metal barrier layer 222. Finally, a metal conductive material such as W is deposited on a surface of the metal barrier layer 222 to form the first conductive layer 223. The metal barrier layer 222 is not only configured to prevent metal particles in the first conductive layer 223 from diffusing into the polysilicon layer 221, but also can increase adhesion between the first conductive layer 223 and the polysilicon layer 221.

In this embodiment, an example where the mask layer 40 includes two mask layers (a first mask layer 24 and a second mask layer 25) and the sacrificial layer 41 includes two sacrificial layers (a first sacrificial layer 26 and a second sacrificial layer 27) is set forth for description. As an example, after the first conductive layer 223 is formed, a first mask material is deposited on a surface of the first conductive layer 223 to form the first mask layer 24. Then, a second mask material is deposited on a surface of the first mask layer 24 to form a second mask layer 25. The first mask layer 24 may be made of ACL (amorphous carbon), and the second mask layer 25 may be made of SION. Next, a first sacrificial material is deposited on a surface of the second mask layer 25 to form the first sacrificial layer 26. A person skilled in the art can also deposit a second sacrificial material on the first sacrificial layer 26 before etching the first sacrificial layer 26 to form the first trench 261 to form a layer covering the first sacrificial layer 26 of the second sacrificial layer 27. Then, using the second mask layer 25 as an etch stop layer, the second sacrificial layer 27 and the first sacrificial layer 26 are etched along a direction perpendicular to the substrate 20 to form the first trench 261. The first trench 261 continuously penetrates the second sacrificial layer 27 and the first sacrificial layer 26 in a direction perpendicular to the substrate 20. Those skilled in the art can also configure the mask layer 40 as only including one mask layer according to actual needs. Those skilled in the art can also configure the sacrificial layer 41 only include one sacrificial layer according to actual needs.

The first sacrificial layer 26 may be made of SOH (spin-on hard mask material), and the second sacrificial layer 27 may be made of SION (silicon oxynitride). Alternatively, the first sacrificial layer 26 is made of silicon oxynitride, and the material of the second sacrificial layer 27 is different from that of the first sacrificial layer 26.

In step S12, a first insulating layer 28 is formed on the sacrificial layer 41, the first insulating layer 28 covers a top surface of the sacrificial layer 41, a bottom of the first trench 261 and sidewalls of the first trench 261, as shown in FIG. 2A.

In some embodiments, the manufacturing method of a semiconductor structure includes:
forming the first insulating layer 28 by an atomic layer deposition process.

As an example, after the first trench 261 is formed, the atomic layer deposition process may be used to deposit a first insulating material to form the first insulating layer 28. The first insulating layer 28 covers an inner wall of the first trench 261 and a top surface of the second sacrificial layer 27 (i.e., a surface of the second sacrificial layer 27 away from the substrate 20). Compared with other deposition processes, the atomic layer deposition process can accurately control a thickness of the first insulating layer 28, and can control the thickness of the first insulating layer 28 at all positions to be the same, so as to meet the process requirements. The first insulating layer 28 may be made of silicon dioxide. The process of forming silicon dioxide is simple and low in cost, and the formed silicon dioxide is closely attached to a sidewall surface of the first trench 261, so that the morphology of the subsequently formed semiconductor structure meets the requirements.

Figure 2B:
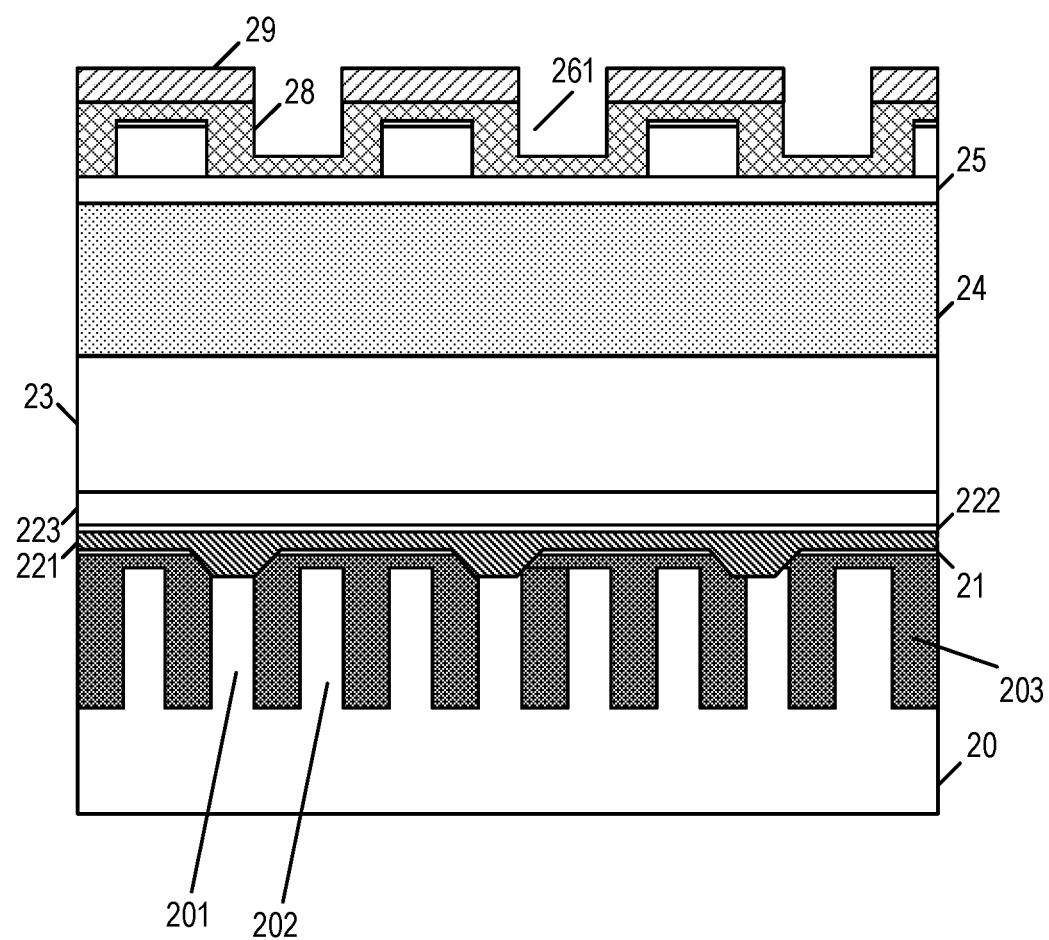

In step S13, a protective layer 13 is formed, and the protective layer 29 only covers a surface of the first insulating layer above the top surface of the sacrificial layer 14, as shown in FIG. 2B.

Those skilled in the art can choose an appropriate method according to actual needs to form the protective layer 29 covering and only covering the first insulating layer 28 on the top surface of the second sacrificial layer 27, and the first insulating layer 28 on the inner wall of the first trench 261 (including the bottom wall and sidewalls of the first trench 261) is not covered with the protective layer 29. In order to better protect the first insulating layer 28 on the sidewalls of the first trench 261, there should be a higher etch selectivity ratio between the protective layer 29 and the first insulating layer 28; for example, under the same etching condition, the etch selectivity ratio between the protective layer 29 and the first insulating layer 28 is greater than 10.

In some embodiments, the manufacturing method of a semiconductor structure includes:

depositing a carbon material on the surface of the first insulating layer 28 above the top surface of the sacrificial layer 41 to form the protective layer 29.

In some embodiments, the process of forming the protective layer 29 includes the following step:

carrying out a plasma reaction to decompose $CH_4$ into a carbon layer, the carbon layer being deposited on the surface of the first insulating layer 28 above the top surface of the sacrificial layer 41.

In this embodiment, a plasma enhanced chemical vapor deposition process is used to form the carbon layer. As an example, after the substrate 20 shown in FIG. 2A is placed in a reaction chamber, a carbon-based gas such as $CH_4$ is transferred into the reaction chamber, and the carbon-based gas such as $CH_4$ passes through an alternating electric field under a low-temperature, low-pressure and vacuum condition, and by setting a suitable radio frequency voltage, the carbon-based gas such as $CH_4$ undergoes plasma reaction and is decomposed into a carbon layer. The reaction process is as follows:

$CH_4 \rightarrow CH_3 \cdot + H$ $CH_4 \rightarrow CH_2 \cdot + 2H$ $CH_4 \rightarrow CH \cdot + 3H$ $CH_4 \rightarrow C \cdot + 4H$ Under a low-temperature and low-pressure condition, a carbon-containing radical group, such as $CH_3 \cdot$, $CH_2 \cdot$, $CH \cdot$, and $C \cdot$, with a relatively low molecular weight is only deposited on the first insulating layer 28 on the top surface of the second sacrificial layer 27; in this way, the protective layer 29 formed covers and only covers the first insulating layer 28 located on the top surface of the second sacrificial layer 27, and no carbon-containing free radical, such as $CH_3 \cdot$, $CH_2 \cdot$, $CH \cdot$, and $C \cdot$, enters the inside of the first trench 261, that is, no carbon layer is deposited inside the first trench 261.

The low pressure in this embodiment refers to a pressure between 2 mTorr and 100 mTorr. The low temperature refers to a temperature between 20° C. and 40° C.

This embodiment is described by an example where $CH_4$ is used as a reaction gas to generate the carbon layer. Those skilled in the art can also select other hydrocarbon gases such as $C_2H_6$ and $C_2H_2$ to form the carbon layer according to actual needs.

In some embodiments, the protective layer 29 covers the first insulating layer 28 on the entire top surface of the sacrificial layer 41. In this embodiment, by accurately controlling the covering position of the protective layer 29, the first insulating layer 28 on the sidewalls of the first trench 261 can be effectively protected.

Figure 2C:
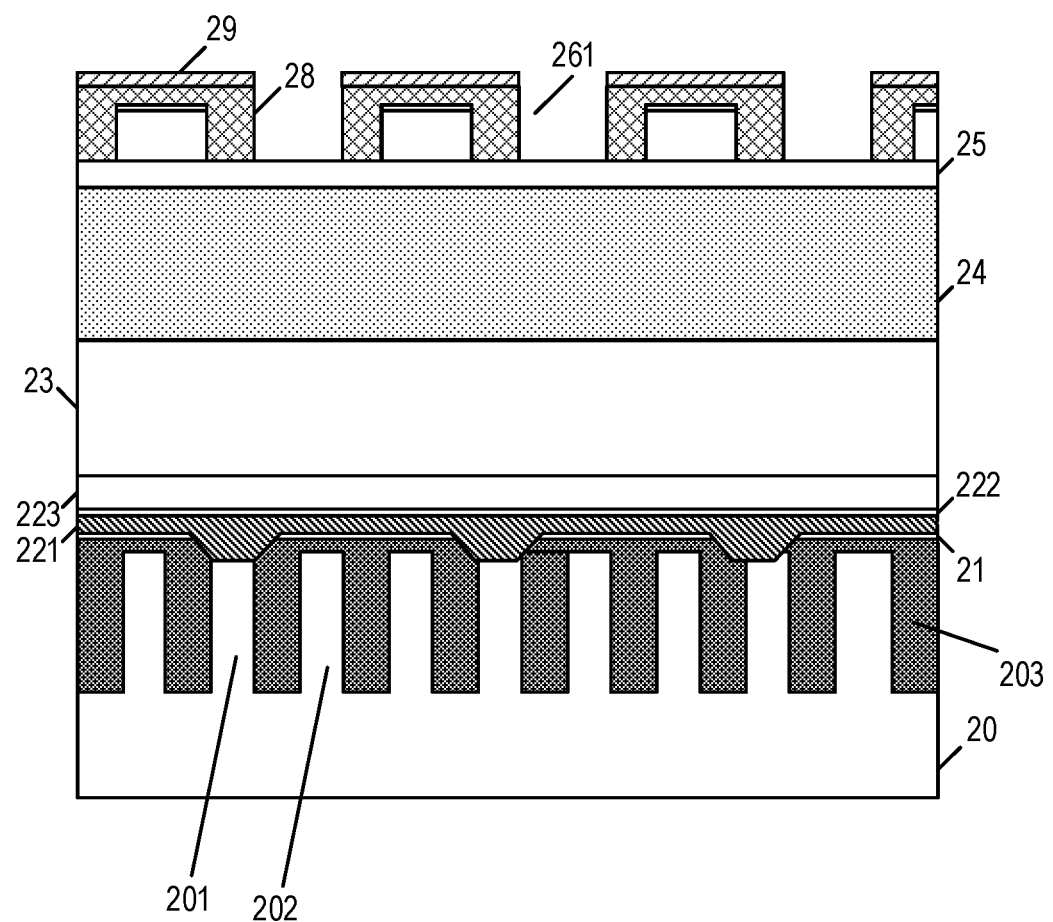

In step S14, the first insulating layer 28 located at the bottom of the first trench 261 is removed, as shown in FIG. 2C.

In some embodiments, the step of removing the first insulating layer 28 located at the bottom of the first trench 261 includes:

Using the protective layer 29 as a mask, the first insulating layer 28 at the bottom of the first trench 261 is etched by an etching process.

As an example, after the protective layer 29 only covering the first insulating layer 28 on the top surface of the second sacrificial layer 27 is formed, and in the process of etching the first insulating layer 28 at the bottom of the first trench 261, damage to the first insulating layer 28 on the sidewalls of the first trench 261 can be avoided. In this way, it can be ensured that after the first insulating layer 28 at the bottom of the first trench 261 is etched, the first insulating layer 28 on the sidewalls of the first trench 261 is not damaged and has a relatively flat, smooth and vertical morphology; the morphology of the pattern that is subsequently transferred downward is improved, thereby ensuring the flat and smooth sidewall morphology of the BL formed subsequently.

In some embodiments, a thickness of the protective layer 29 is greater than a thickness of the first insulating layer 28.

As an example, in the process of etching the first insulating layer 28 at the bottom of the first trench 261, part of the protective layer 29 will be etched. Therefore, when the thickness of the protective layer 29 is set to be greater than the thickness of the first insulating layer 28, even if the protective layer 29 is partially etched, in the process of removing the first insulating layer 28 at the bottom of the first trench 261, the first insulating layer 28 on the top surface of the second sacrificial layer 27 is always covered with the protective layer 29, so as to better protect the first insulating layer 28 on the sidewalls of the first trench 261.

In some embodiments, the manufacturing method of a semiconductor structure includes:

after the step of forming the protective layer 29, the step of removing the first insulating layer 28 located at the bottom of the first trench 261 is performed in situ.

As an example, the step of forming the protective layer 29 and the step of removing the first insulating layer 28 located at the bottom of the first trench 261 are completed in the same machine; in this way, the semiconductor structure does not need to be transferred between different machines, the manufacturing steps of the semiconductor structure are simplified, possible contamination to the semiconductor structure can be avoided during the transfer process, and the yield of the semiconductor structure can be ensured.

In step S15, the protective layer 29, part of the first insulating layer 28, the sacrificial layer 41 and part of the mask layer 40 are removed to form a first pattern layer.

Figure 2D:
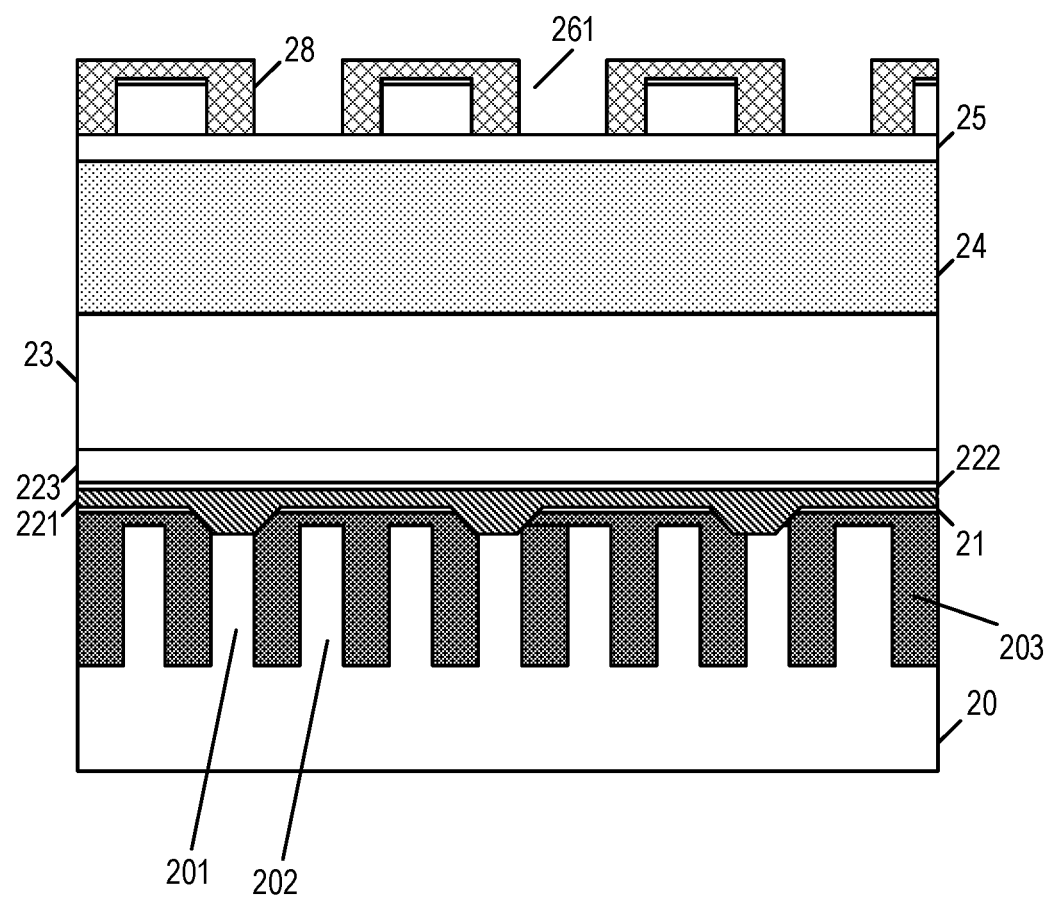
Figure 2E:
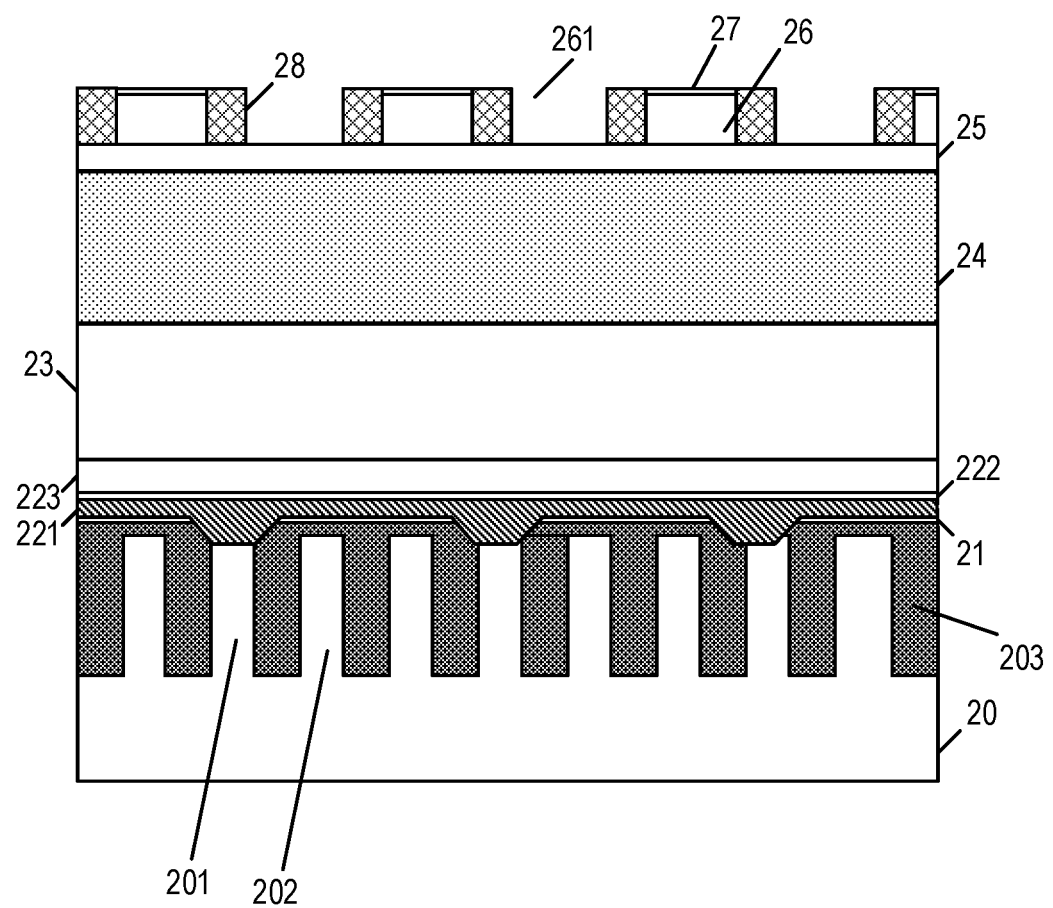

In some embodiments, the step of removing the protective layer 29, part of the first insulating layer 28, the sacrificial layer 41 and part of the mask layer 40 to form the first pattern layer includes:

carrying out an etching process to remove the protective layer 29, as shown in FIG. 2D;

carrying out a planarization process to remove the first insulating layer 28 above the top surface of the sacrificial layer 41, as shown in FIG. 2E; and carrying out an etching process to remove the sacrificial layer 41 and part of the mask layer 40.

As an example, after the first insulating layer 28 at the bottom of the first trench 261 is opened, the remaining protective layer 29 is stripped off by an etching process to expose the first insulating layer 28 on the top surface of the second sacrificial layer 27, as shown in FIG. 2D. Next, using the second sacrificial layer 27 as a polishing stop layer, a planarization process such as a chemical mechanical polishing process is carried out to remove the first insulating layer 28 on the top surface of the second sacrificial layer 27 to expose the second sacrificial layer 27, as shown in FIG. 2E.

Figure 2F:
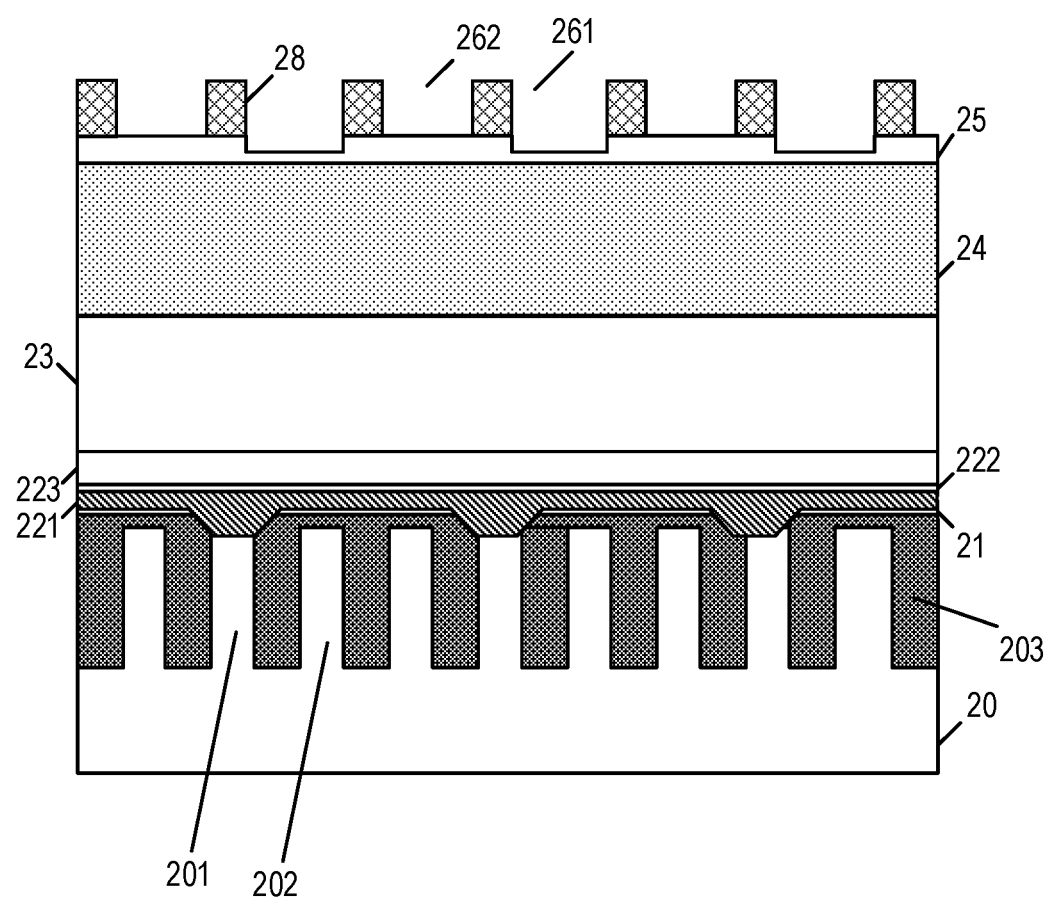

After the second sacrificial layer 27 is exposed, the second sacrificial layer 27 and the first sacrificial layer 26 are etched away by a wet etching process or a dry etching process, to form a second trench 262 at the position of the first sacrificial layer 26 in FIG. 2E, as shown in FIG. 2F. In a direction parallel to the surface of the substrate 20, the first trenches 261 and the second trenches 262 are alternately arranged, and the first insulating layer 28 is configured to isolate the adjacent first trenches 261 and second trenches 262. A width of the first trench 261 and a width of the second trench 262 may be the same or different. The width of the first trench 261 refers to an inner diameter of the first trench 261, and the width of the second trench 262 refers to an inner diameter of the second trench 262.

Figure 2G:
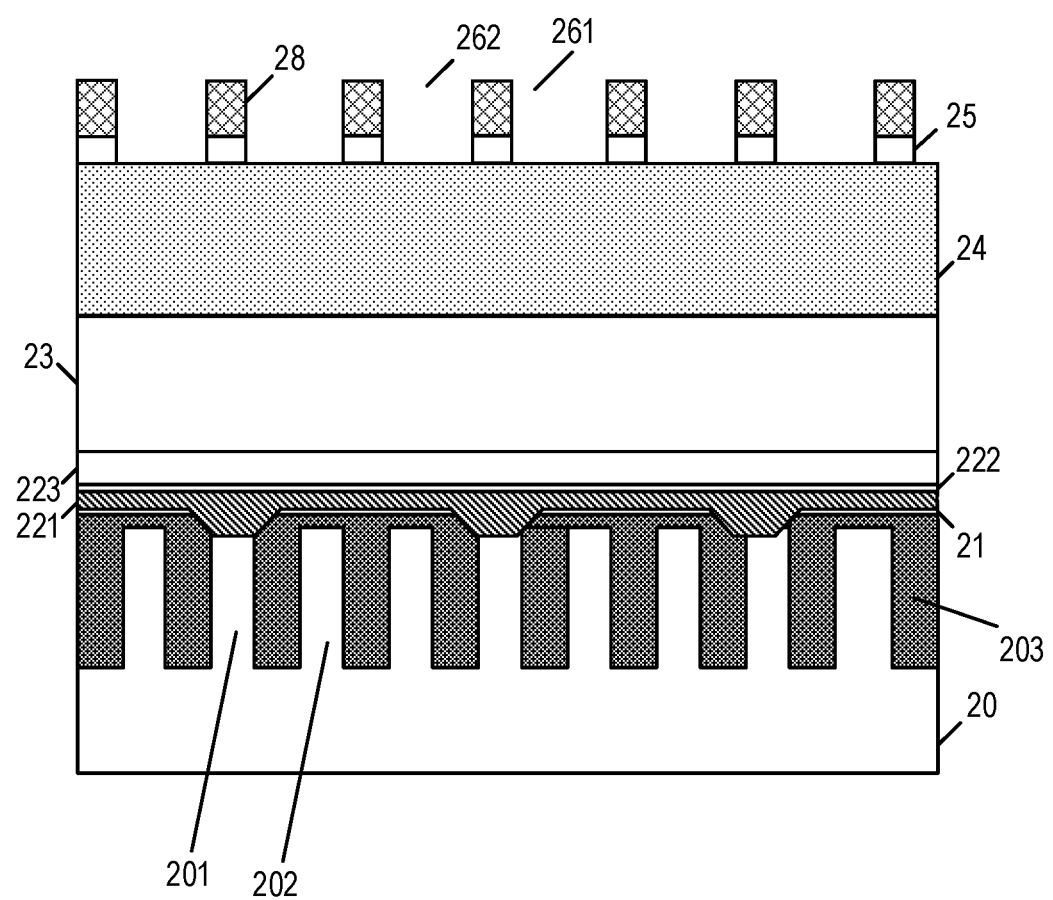
Figure 2H:
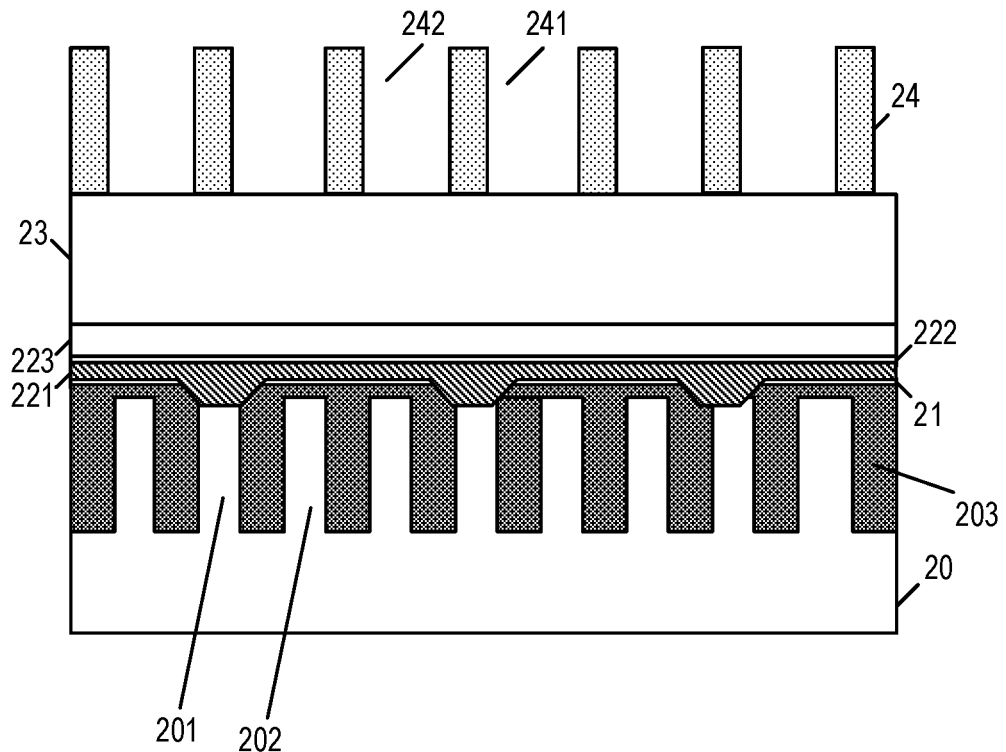
Figure 2I:
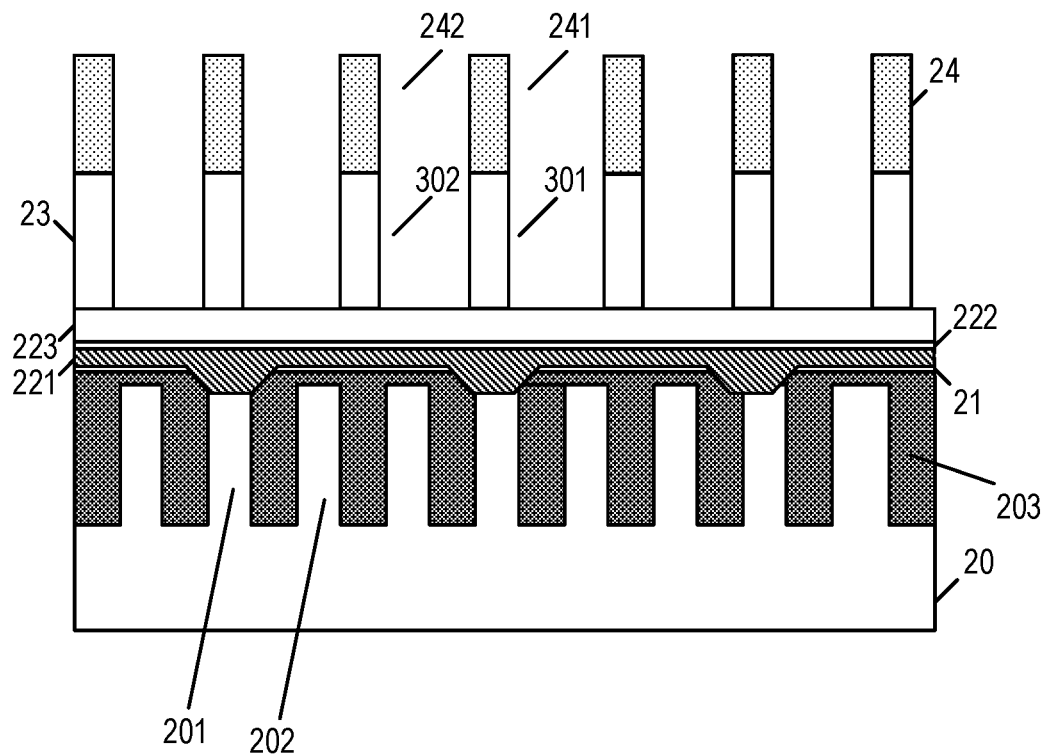
Figure 2J:
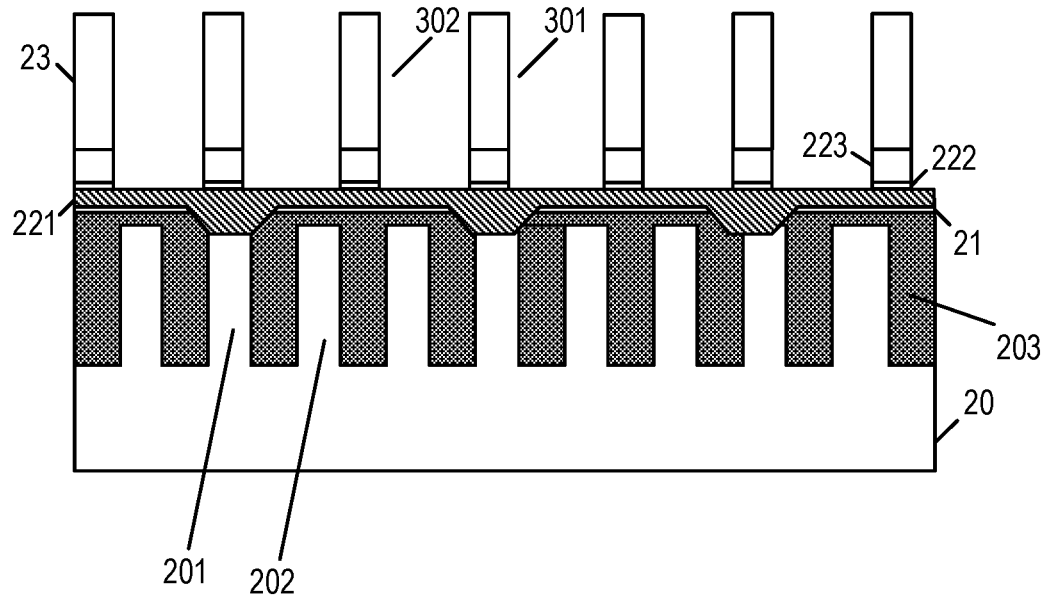

After the first trench 261 and the second trench 262 are formed, the second mask layer 25 is etched first using the first trench 261 and the second trench 262 as mask patterns so that the first trench 261 and the second trench 262 extend into the second mask layer 25, that is, the first trench 261 and the second trench 262 both penetrate the second mask layer 25 in a direction perpendicular to the substrate 20 to form a structure as shown in FIG. 2G. Next, the pattern is further transferred downward, and by etching part of the first mask layer 24, a fifth trench 241 corresponding to the first trench 261 and a sixth trench 242 corresponding to the second trench 262 are formed in the first mask layer 24. After the first insulating layer 28 and the second mask layer 25 remaining on the first mask layer 24 are removed, a structure as shown in FIG. 2H is obtained. The first pattern layer in this embodiment serves as the first mask layer 24 including the fifth trench 241 and the sixth trench 242. Since the first trench 261 and the second trench 262 have flat and vertical sidewall topography, the fifth trench 241 and the sixth trench 242 formed in the first mask layer 24 likewise have flat and vertical sidewall topography, which avoids the distortion problem of the first pattern layer.

Figure 2K:
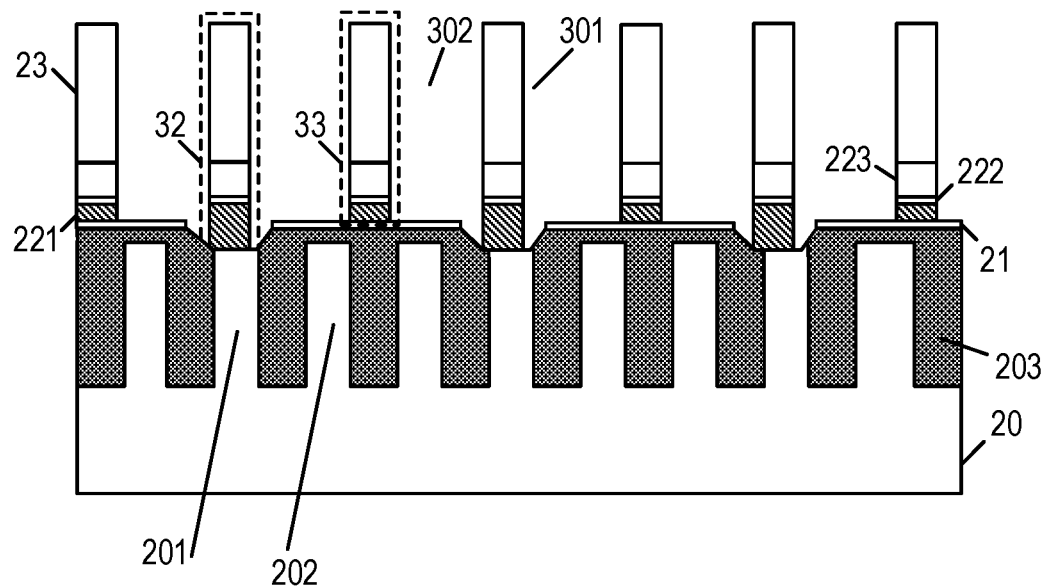

In step S16, using the first pattern layer as a mask, part of the first dielectric layer 23, part of the first conductive layer 223, and part of the polysilicon layer 221 are removed to form a BL structure, as shown in FIG. 2K.

As an example, firstly, the first dielectric layer 23 is etched along the fifth and sixth trenches 241, 242 in the first mask layer 24, to form, in the first dielectric layer 23, a third trench 301 corresponding to the first trench 261 and a fourth trench 302 corresponding to the second trench 262, as shown in FIG. 2I.

Next, the first conductive layer 223 and the metal barrier layer 222 are etched sequentially along the third and fourth trenches 301, 302 in the first dielectric layer 23, so that the third trench 301 and the fourth trench 302 extend into the first conductive layer 223 and the metal barrier layer 222, that is, the third trench 301 and the fourth trench 302 both penetrate the first conductive layer 223 and the metal barrier layer 222 in a direction perpendicular to the substrate 20; and after the first mask layer 24 is peeled off, a structure shown in FIG. 2J is obtained.

Then, the polysilicon layer 221 is further etched downward so that both the third trench 301 and the fourth trench 302 extend into the substrate 20 or to the surface of the substrate 20, thus forming a structure as shown in FIG. 2K.

This embodiment is described by an example where the first conductive layer 223, the metal barrier layer 222 and the polysilicon layer 221 are etched step by step. In other embodiments, those skilled in the art can also select a suitable etchant according to the materials of the first conductive layer 223, the metal barrier layer 222, and the polysilicon layer 221, and then the first conductive layer 223, the metal barrier layer 222 and the polysilicon layer 221 are etched in one step, thus simplifying the manufacturing method of the semiconductor structure.

In some embodiments, the AAs 42 in the substrate 20 include first AAs 201 and second AAs 202; the step of forming a BL structure includes:

etching the first dielectric layer 23, the first conductive layer 223, the metal barrier layer 222 and the polysilicon layer 221 along the first trench 261 and the second trench 262 to form a third trench 301 corresponding to the first trench 261 and a fourth trench 302 corresponding to the second trench 262, wherein the third trench 301 and the fourth trench 302 divide the first dielectric layer 23, the first conductive layer 223, the metal barrier layer 222, and the polysilicon layer 221 into a first BL structure 32 and a second BL structure 33, the first BL structure 32 is in contact with the first AA 201, and the second BL structure 33 is not in contact with the second AA 202.

Sidewalls of the first BL structure 32 and the second BL structure 33 formed in this embodiment are flat and smooth, and the first BL structure 32 and the second BL structure 33 have vertical morphology.

In some embodiments, after the step of forming a BL structure, the method further includes:

forming a BL isolation layer at least covering the sidewall of the BL structure.

Figure 2L:
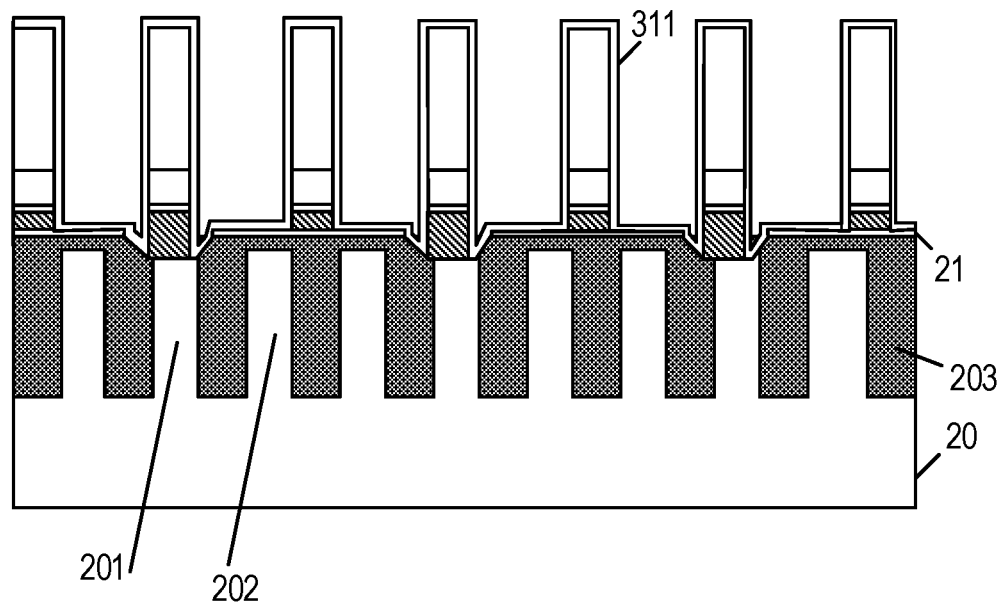
Figure 2M:
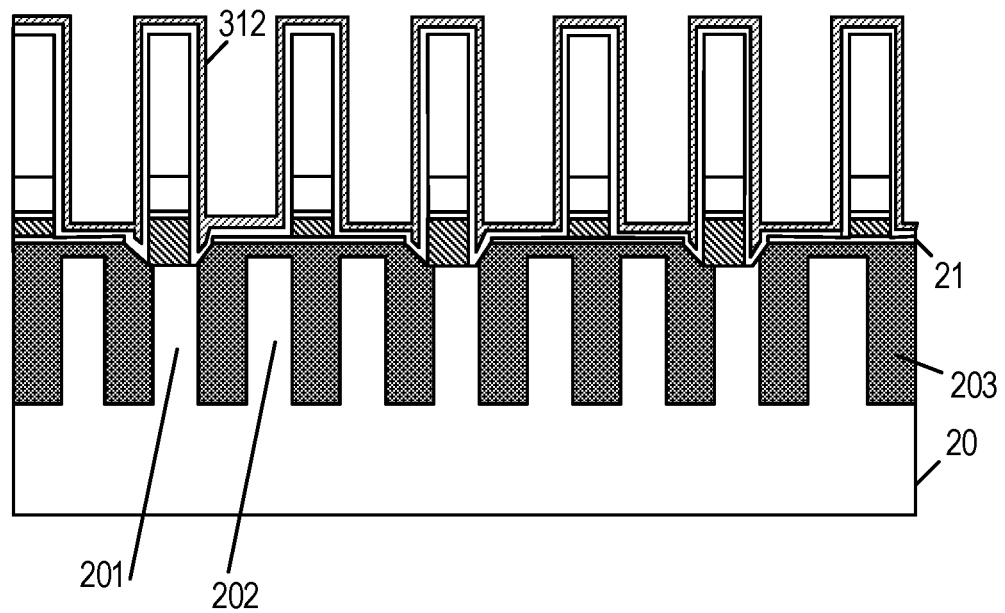
Figure 2N:
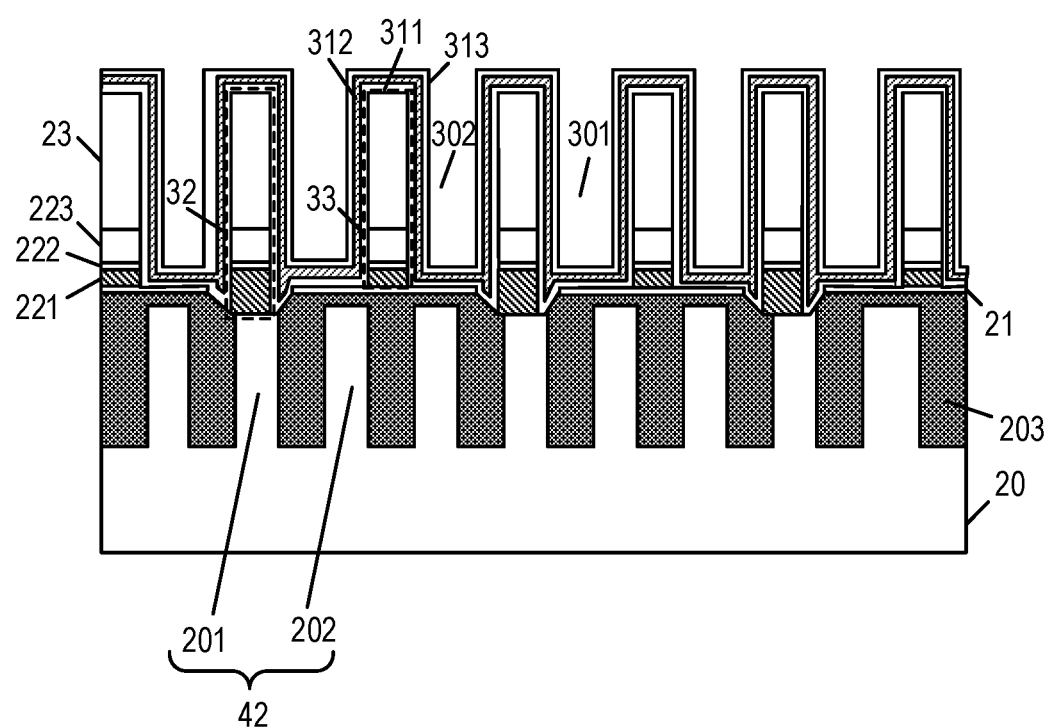

In some embodiments, the step of forming a BL isolation layer includes:

forming a first isolation layer 311 at least covering the sidewall of the BL structure, as shown in FIG. 2L;

forming a second isolation layer 312 covering a surface of the first isolation layer 311, as shown in FIG. 2M;

forming a third isolation layer 313 covering a surface of the second isolation layer 312, as shown in FIG. 2N;

wherein the first isolation layer 311, the second isolation layer 312, and the third isolation layer 313 constitute the BL isolation layer.

As an example, after the first BL structure 32 and the second BL structure 33 are formed, a first isolation material is simultaneously deposited on the surface of the first BL structure 32, the surface of the second BL structure 33, the exposed surface of the substrate 20, and the surface of the spacer layer 21 to form a first isolation Layer 311, as shown in FIG. 2L. Next, a second isolation material is deposited on the surface of the first isolation layer 311 to form a second isolation layer 312 that completely covers the first isolation layer 311, as shown in FIG. 2M. Then, a third isolation material is deposited on the surface of the second isolation layer 312 to form a third isolation layer 313 that completely covers the second isolation layer 312, as shown in FIG. 2N. The BL isolation layer is not only configured to separate the adjacent BL structures, but also can prevent oxidation of the sidewall of the BL structure, thus ensuring the electrical performance of the BL structure.

In order to simultaneously achieving the functions of reducing parasitic capacitance and protecting the BL structure. In some embodiments, the manufacturing method of a semiconductor structure further includes:

a material of the first isolation layer 311 having a higher density than a material of the second isolation layer 312, the material of the first isolation layer 311 having a higher dielectric constant than the material of the second isolation layer 312.

The material of the first isolation layer 311 may be the same as a material of the third isolation layer 313. However, the material of the first isolation layer 311 or the material of the third isolation layer 313 is different from the material of the second isolation layer 312. For example, the material of the first isolation layer 311 may be a nitride material (e.g., silicon nitride), and the material of the second isolation layer 312 may be an oxide material (e.g., silicon oxide), and thus the BL isolation layer of an N—O—N structure is formed.

A thickness relationship among the first isolation layer 311, the second isolation layer 312, and the third isolation layer 313 can be determined according to the dielectric constant of the material of the first isolation layer 311, the dielectric constant of the material of the second isolation layer 312, and the dielectric constant of the material of the third isolation layer 313. For example, when the material of the first isolation layer 311 and the material of the third isolation layer 313 are both silicon nitride and the material of the second isolation layer 312 is silicon oxide, the thickness of the first isolation layer 311 is the same as the thickness of the third isolation layer 313, and the thickness of the first isolation layer 311 is greater than the thickness of the second isolation layer 312.

Moreover, this embodiment further provides a semiconductor structure. The semiconductor structure provided in this embodiment can be formed by the manufacturing method of a semiconductor structure shown in FIGS. 1 and 2A-2N. Referring to FIG. 2N, a schematic diagram of the semiconductor structure provided in this embodiment is illustrated. As shown in FIGS. 2A-2N, the semiconductor structure according to this embodiment includes:

a substrate 20; and
a BL structure located on a surface of the substrate, the BL structure being formed by the manufacturing method of a semiconductor structure according to any one of the above embodiments.

In the semiconductor structure and the manufacturing method thereof according to the embodiments, the protective layer is formed to cover, and only cover the first insulating layer on the top surface of the sacrificial layer. In this way, during the subsequent removal of the first insulating layer at the bottom of the first trench, the top surface of the first sacrificial layer and the first insulating layer on the sidewalls of the first trench will not be damaged; after the pattern in the sacrificial layer is transferred downward, a BL with flat and smooth sidewalls and vertical topography can be obtained, which improves the uniformity and consistency of the BL topography in the semiconductor structure and is contributed to improving the electrical performance of the semiconductor structure.

The above are only specific implementations of the present disclosure, but the protection scope of the present disclosure is not limited to this. Any changes or substitutions reached easily by those skilled in the art within the technical scope disclosed in the present disclosure shall fall within the scope of the present disclosure. Therefore, the scope of the present disclosure should be defined by the scope of the appended claims.

What is claimed is:

1. A manufacturing method of a semiconductor structure, comprising:
providing a substrate, the substrate comprising a polysilicon layer, a first conductive layer, a first dielectric layer, a mask layer, and a sacrificial layer sequentially formed thereon, wherein the sacrificial layer has a plurality of first trenches distributed at intervals and the polysilicon layer is electrically connected to an Active Area in the substrate;
forming a first insulating layer on the sacrificial layer, the first insulating layer covering a top surface of the sacrificial layer, a bottom of the first trench, and sidewalls of the first trench;
forming a protective layer, the protective layer only covering a surface of the first insulating layer above the top surface of the sacrificial layer;
removing the first insulating layer located at the bottom of the first trench;
removing the protective layer, part of the first insulating layer, the sacrificial layer, and part of the mask layer to form a first pattern layer; and
removing part of the first dielectric layer, part of the first conductive layer, and part of the polysilicon layer by using the first pattern layer as a mask to form a bit line structure.

2. The manufacturing method of a semiconductor structure according to claim 1, comprising:
depositing a carbon material on the surface of the first insulating layer above the top surface of the sacrificial layer to form the protective layer.

3. The manufacturing method of a semiconductor structure according to claim 2, wherein the step of forming a protective layer comprises:
carrying out a plasma reaction to decompose $CH_4$ into a carbon layer, the carbon layer being deposited on the surface of the first insulating layer above the top surface of the sacrificial layer.

4. The manufacturing method of a semiconductor structure according to claim 1, comprising:
forming the first insulating layer by an atomic layer deposition process.

5. The manufacturing method of a semiconductor structure according to claim 4, wherein:
the first insulating layer being made of silicon dioxide.

6. The manufacturing method of a semiconductor structure according to claim 5, comprising:
after the step of forming the protective layer, performing a step of removing the first insulating layer located at the bottom of the first trench in situ.

7. The manufacturing method of a semiconductor structure according to claim 1, wherein the step of removing the first insulating layer located at the bottom of the first trench comprises:
by using the protective layer as a mask, etching the first insulating layer located at the bottom of the first trench by an etching process.

8. The manufacturing method of a semiconductor structure according to claim 1, wherein the step of removing the protective layer, part of the first insulating layer, the sacrificial layer and part of the mask layer to form the first pattern layer comprises:
carrying out an etching process to remove the protective layer;
carrying out a planarization process to remove the first insulating layer above the top surface of the sacrificial layer; and
carrying out an etching process to remove the sacrificial layer and part of the mask layer.

9. The manufacturing method of a semiconductor structure according to claim 1, wherein the substrate further comprises: a metal barrier layer located between the polysilicon layer and the first conductive layer.

10. The manufacturing method of a semiconductor structure according to claim 1, after the step of forming the bit line structure, the method further comprises:
forming a bit line isolation layer at least covering the sidewall of the bit line structure.

11. The manufacturing method of a semiconductor structure according to claim 10, wherein the step of forming the bit line isolation layer comprises:
forming a first isolation layer at least covering the sidewall of the bit line structure;

forming a second isolation layer covering a surface of the first isolation layer; and forming a third isolation layer covering a surface of the second isolation layer;

wherein the first isolation layer, the second isolation layer, and the third isolation layer constitute the bit line isolation layer.

12. The manufacturing method of a semiconductor structure according to claim 11, wherein:

a material of the first isolation layer has a higher density than a material of the second isolation layer, the material of the first isolation layer has a higher dielectric constant than the material of the second isolation layer.

13. The manufacturing method of a semiconductor structure according to claim 12, wherein:

the material of the first isolation layer is the same as the material of the third isolation layer.

14. The manufacturing method of a semiconductor structure according to claim 13, wherein:

the material of the first isolation layer is silicon nitride and the material of the second isolation layer is silicon oxide.

15. A semiconductor structure, comprising:

a substrate; and a bit line structure located on a surface of the substrate, the bit line structure being formed by the manufacturing method of a semiconductor structure according to claim 1.

* * * * *